United States Patent
Den Boef et al.

(10) Patent No.: US 8,529,823 B2
(45) Date of Patent: Sep. 10, 2013

(54) IMPRINT LITHOGRAPHY

(75) Inventors: Arie Jeffrey Den Boef, Waalre (NL); Vadim Yevgenyevich Banine, Deurne (NL); Andre Bernardus Jeunink, Bergeijk (NL); Sander Frederik Wuister, Eindhoven (NL); Yvonne Wendela Kruijt-Stegeman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 312 days.

(21) Appl. No.: 12/891,422

(22) Filed: Sep. 27, 2010

(65) Prior Publication Data

US 2011/0076352 A1 Mar. 31, 2011

Related U.S. Application Data

(60) Provisional application No. 61/246,594, filed on Sep. 29, 2009.

(51) Int. Cl.
*B28B 11/10* (2006.01)
*G01B 11/00* (2006.01)

(52) U.S. Cl.
USPC ........ 264/408; 425/150; 425/385; 425/174.4; 264/293; 264/401; 264/40.7

(58) Field of Classification Search
USPC ............... 264/401, 293, 40.7, 408; 425/150, 425/174.4, 385
See application file for complete search history.

(56) References Cited

U.S. PATENT DOCUMENTS

| | | | |
|---|---|---|---|
| 4,731,155 A | 3/1988 | Napoli et al. | |
| 5,772,905 A | 6/1998 | Chou | |
| 6,334,960 B1 | 1/2002 | Willson et al. | |
| 6,916,584 B2 * | 7/2005 | Sreenivasan et al. | 430/22 |
| 7,418,902 B2 * | 9/2008 | Kruijt-Stegeman et al. | 101/485 |
| 7,618,250 B2 | 11/2009 | Van Santen et al. | |

(Continued)

FOREIGN PATENT DOCUMENTS

| | | |
|---|---|---|
| JP | 61-140136 | 6/1986 |
| JP | 62-188317 | 8/1987 |

(Continued)

OTHER PUBLICATIONS

J. Haisma, "Mold-Assisted Nanolithography: A Process for Reliable Pattern Replication," *J. Vac. Sci. Technol.* B 14(6), Nov./Dec. 1996.

(Continued)

*Primary Examiner* — Joseph S Del Sole
*Assistant Examiner* — Nahida Sultana
(74) *Attorney, Agent, or Firm* — Pillsbury Winthrop Shaw Pittman LLP

(57) ABSTRACT

A method of determining an offset between an imprint template and a substrate using an alignment grating on the imprint template and an alignment grating on the substrate is disclosed. The method includes bringing the imprint template alignment grating and the substrate alignment grating sufficiently close together such that they form a composite grating, directing an alignment radiation beam at the composite grating while modulating the relative position of the imprint template and the substrate, detecting the intensity of alignment radiation which is reflected from the composite grating, and determining the offset by analyzing modulation of the detected intensity.

20 Claims, 6 Drawing Sheets

(56) References Cited

U.S. PATENT DOCUMENTS

| | | | |
|---|---|---|---|
| 7,815,424 B2 * | 10/2010 | Nakamura et al. | 425/150 |
| 2004/0124566 A1 | 7/2004 | Sreenivasan et al. | |
| 2005/0274693 A1 | 12/2005 | Heidari et al. | |
| 2006/0267231 A1 * | 11/2006 | Van Santen et al. | 264/40.1 |
| 2006/0275524 A1 | 12/2006 | Santen et al. | |
| 2007/0057168 A1 | 3/2007 | Imai | |
| 2007/0267571 A1 | 11/2007 | Imai et al. | |
| 2008/0185506 A1 | 8/2008 | Watanabe et al. | |
| 2008/0258050 A1 * | 10/2008 | Makinouchi et al. | 250/229 |
| 2009/0026657 A1 * | 1/2009 | Nimmakayala et al. | 264/293 |
| 2009/0135388 A1 | 5/2009 | Imai et al. | |
| 2009/0152239 A1 * | 6/2009 | Terasaki et al. | 216/41 |
| 2009/0267781 A1 | 10/2009 | Watanabe et al. | |
| 2010/0195102 A1 * | 8/2010 | Den Boef | 356/401 |
| 2011/0001254 A1 * | 1/2011 | Kruijt-Stegeman et al. | 264/40.5 |
| 2011/0018168 A1 * | 1/2011 | Wuister et al. | 264/293 |
| 2011/0076352 A1 * | 3/2011 | Den Boef et al. | 425/385 |
| 2011/0221095 A1 * | 9/2011 | Sreenivasan et al. | 264/293 |
| 2011/0266706 A1 * | 11/2011 | Dijksman et al. | 264/40.1 |
| 2012/0286443 A1 * | 11/2012 | Sato | 264/40.5 |
| 2012/0313295 A1 * | 12/2012 | Den Boef et al. | 264/406 |
| 2013/0015598 A1 * | 1/2013 | Kimura | 264/40.1 |

FOREIGN PATENT DOCUMENTS

| | | |
|---|---|---|
| JP | 1-251717 | 10/1989 |
| JP | 4-116403 | 4/1992 |
| JP | 5-90125 | 4/1993 |
| JP | 10-27746 | 1/1998 |
| JP | 2005003438 A2 | 1/2005 |
| JP | 2005055360 A2 | 3/2005 |
| JP | 2005114406 A2 | 4/2005 |
| JP | 2005283357 A2 | 10/2005 |
| JP | 2005326231 A2 | 11/2005 |
| JP | 2005326232 A2 | 11/2005 |
| JP | 2006-013400 | 1/2006 |
| JP | 2006-516065 | 6/2006 |
| JP | 2006170696 A2 | 6/2006 |
| JP | 2006170899 A2 | 6/2006 |
| JP | 2006284421 A2 | 10/2006 |
| JP | 2006284520 A2 | 10/2006 |
| JP | 2006-332677 | 12/2006 |
| JP | 2007093546 A2 | 4/2007 |
| JP | 2007095237 A2 | 4/2007 |
| JP | 2007127512 A2 | 5/2007 |
| JP | 2007147283 A2 | 6/2007 |
| JP | 2007147415 A2 | 6/2007 |
| JP | 2007155466 A2 | 6/2007 |
| JP | 2007170938 A2 | 7/2007 |
| JP | 2007178278 A2 | 7/2007 |
| JP | 2007187571 A2 | 7/2007 |
| JP | 2007285717 A2 | 11/2007 |
| JP | 2007303957 A2 | 11/2007 |
| JP | 2008116342 A2 | 5/2008 |
| WO | 02/067055 | 8/2002 |
| WO | 2007074752 A1 | 7/2007 |
| WO | 2007097350 A1 | 8/2007 |
| WO | 2007111228 A1 | 10/2007 |
| WO | 2007138869 A1 | 12/2007 |
| WO | 2008056546 A1 | 5/2008 |
| WO | 2009044542 A1 | 4/2009 |

OTHER PUBLICATIONS

Japanese Office Action mailed Apr. 9, 2012 in corresponding Japanese Patent Application No. 2010-211472.

Japanese Office Action mailed Apr. 1, 2013 in corresponding Japanese Patent Application No. 2010-211472.

* cited by examiner

IMPRINT LITHOGRAPHY

This application claims priority and benefit under 35 U.S.C. §119(e) to U.S. Provisional Patent Application No. 61/246,594, entitled "Imprint Lithography", filed on Sep. 29, 2009. The content of that application is incorporated herein in its entirety by reference.

FIELD

The present invention relates to imprint lithography.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g., nanometer sized features or sub micron sized features) that has gained increasing interest is so-called imprint lithography, which generally involves the use of a "stamp" (often referred to as an imprint template or an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve bringing together a patterned surface of an imprint template and a layer of imprintable medium (e.g., moving the imprint template toward the imprintable medium, or moving the imprintable medium toward the imprint template, or both) such that the imprintable medium flows into recesses in the patterned surface and is pushed aside by protrusions on the patterned surface. The recesses define pattern features of the patterned surface of the imprint template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint template and the patterned imprintable medium are then separated. The substrate and patterned imprintable medium are then typically processed further in order to pattern or further pattern the substrate. The imprintable medium is typically provided in the form of droplets on the surface of a substrate to be patterned, but may alternatively be provided using spin coating or the like.

SUMMARY

Lithography typically involves applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in, e.g., one or more electrical connections between layers not being made. This, in turn, may cause the device to be non-functional. A lithographic apparatus therefore usually includes an alignment apparatus which is intended to align each new pattern with a previously provided pattern.

It is desirable, for example, to provide an imprint lithography alignment apparatus and a method which is novel and inventive over the prior art.

According to an aspect, there is provided a method of determining an offset between an imprint template and a substrate, using a first alignment grating on the imprint template and a first alignment grating on the substrate, the method comprising bringing the first imprint template alignment grating and the first substrate alignment grating sufficiently close together that they form a composite grating; directing an alignment radiation beam at the composite grating while modulating a relative position of the imprint template and the substrate; detecting a property of alignment radiation which is reflected from the composite grating; and determining the offset by analyzing modulation of the detected property arising from the modulation of the relative position of the imprint template and the substrate.

According to an aspect, there is provided An imprint lithography apparatus, comprising: a substrate table configured to hold a substrate; an imprint template holder configured to hold an imprint template; a detector configured to detect a property of alignment radiation reflected from the imprint template and the substrate; and an actuator configured to modulate a relative position of the substrate table and the imprint template holder.

BRIEF DESCRIPTION OF THE DRAWINGS

Specific embodiments of the invention will be described with reference to the accompanying figures, in which.

DETAILED DESCRIPTION

Figure 1A:
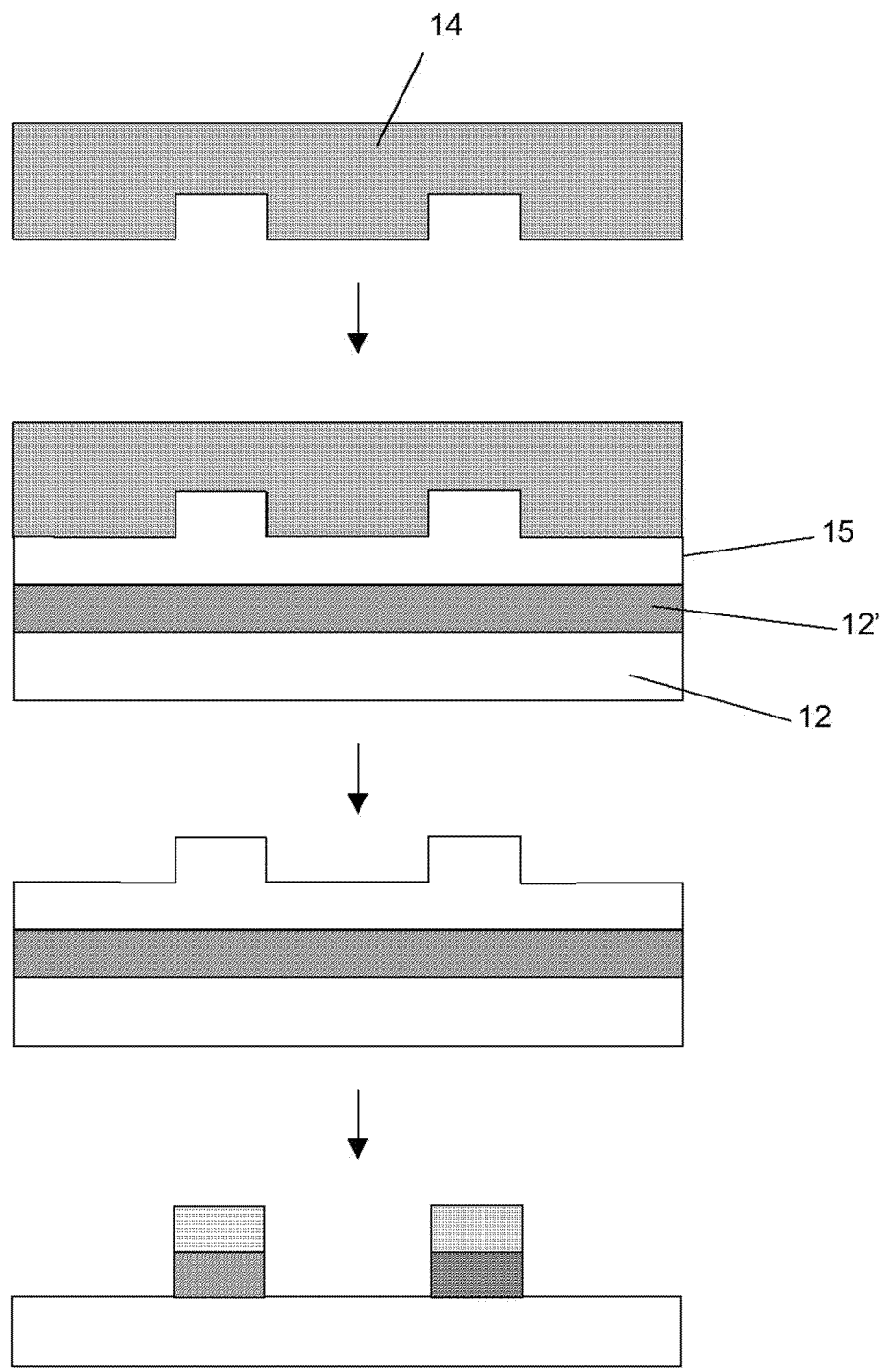
FIGS. 1a and 1b schematically show examples of, respectively, hot imprint, and UV imprint.
Figure 1B:
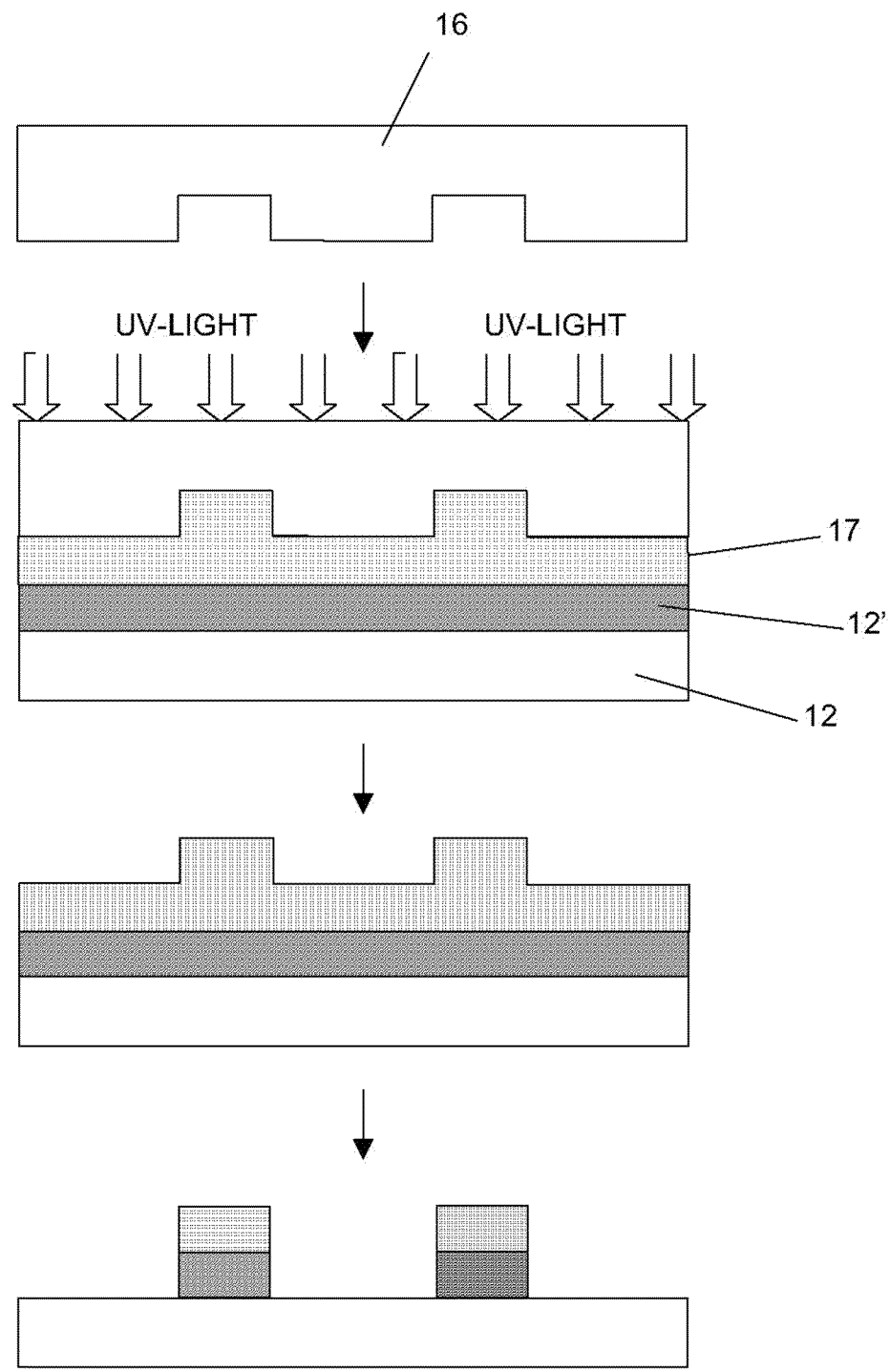

Examples of two known approaches to imprint lithography are schematically depicted in FIGS. 1a and 1b.

FIG. 1a shows an example of so-called hot imprint lithography (or hot embossing). In a typical hot imprint process, a template 14 is imprinted into a thermosetting or a thermoplastic imprintable medium 15 which has been cast on the surface of a substrate 12. The imprintable medium may be, for example, resin. The imprintable medium may for instance be spin coated and baked onto the substrate surface or, as in the example illustrated, onto a planarization and transfer layer 12'. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template may then be removed and the patterned resin cooled. In hot imprint lithography employing a layer of thermoplastic polymer resin, the thermoplastic resin is heated so that it is in a freely flowable state immediately prior to imprinting with the template. It may be necessary to heat a thermoplastic resin to a temperature considerably above the glass transition temperature of the resin. The template is pressed into the flowable resin and then cooled to below its glass transition temperature with the template in place to harden the pattern. Thereafter, the template is removed. The pattern will consist of the features in relief from a residual layer of the imprintable medium which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

FIG. 1b shows an example of UV imprint lithography, which involves the use of a transparent template and a UV-curable liquid as imprintable medium (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill template pattern features. A quartz template 16 is applied to a UV-curable resin 17 in a similar manner to the process of FIG. 1b. However, instead of using heat or temperature cycling as in hot imprint, the pattern is frozen by curing the imprintable medium with UV radiation that is applied through the quartz template onto the imprintable medium. Thereafter, the template is removed. The pattern will consist of the features in relief from a residual layer of the imprintable medium which may then be removed by an appropriate etch process to leave only the pattern features. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

Figure 2:
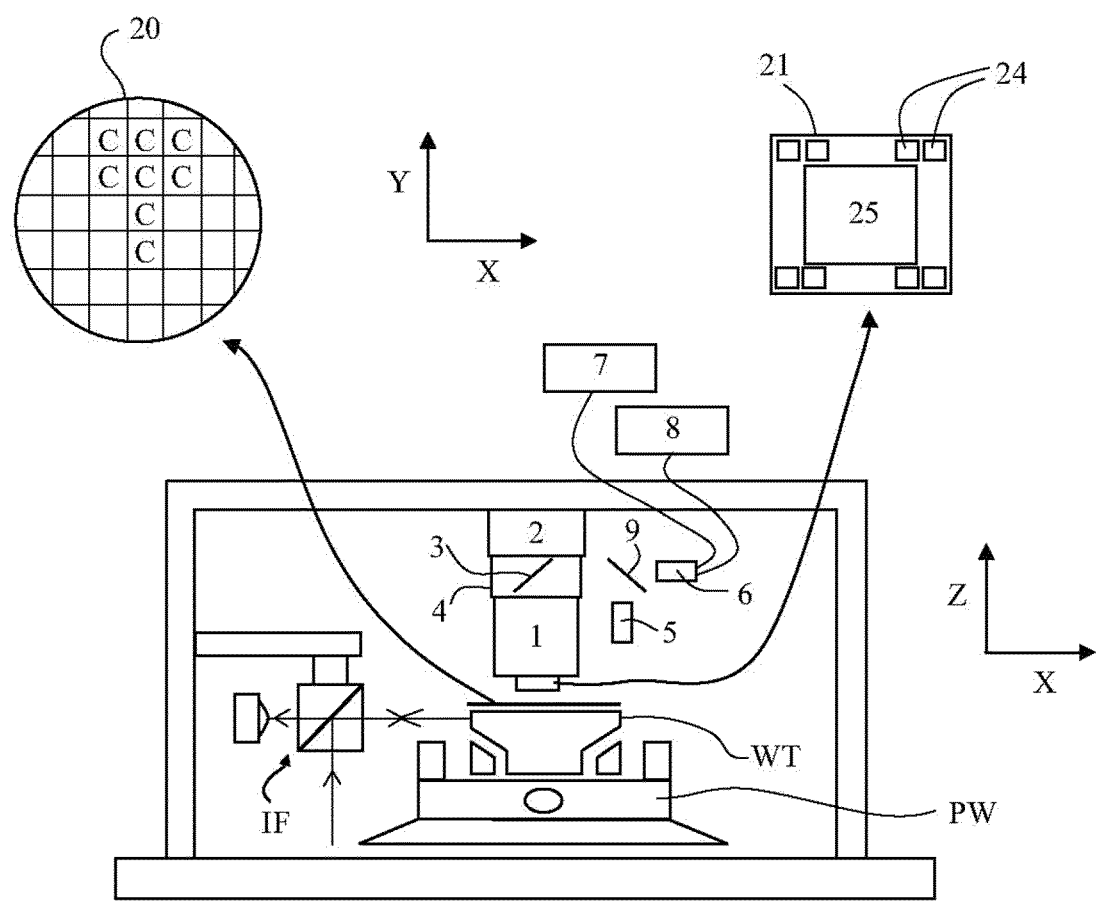
FIG. 2 schematically shows an imprint lithography apparatus according to an embodiment of the invention.

FIG. 2 shows schematically an imprint lithography apparatus according to an embodiment of the invention. The apparatus comprises a substrate table WT which is configured to hold a substrate 20, and an imprint template holder 1 which is configured to hold an imprint template 21. The substrate 20 and imprint template 21 are shown separately, viewed from above. They are enlarged in this view, the imprint template 21 having been enlarged more than the substrate 20. The substrate 20 is divided into a plurality of target portions C. The imprint template includes a patterned region 25 and a plurality of alignment marks 24.

The substrate table WT is connected to a positioning device PW, which is configured to move the substrate table WT such that a target portion C of the substrate 20 is aligned with the imprint template 21. A measuring device IF, such as an interferometer, is used to monitor the position of the substrate table WT.

An output 2 of a source of actinic radiation is located above the imprint template. The output 2 is configured to direct actinic radiation (for example UV radiation) through the imprint template holder 1 and the imprint template 21, such that the actinic radiation is incident upon imprintable medium provided on the substrate 20. A beam-splitter 3 is provided between the output 2 and the imprint template holder 1. The beam-splitter 3 is substantially transparent to actinic radiation emitted by the output 2. The beam-splitter 3 may be held, for example, in a frame 4 which has open faces and thereby allows radiation to pass through it.

An output 5 of a source of alignment radiation is located to one side of the beam-splitter 3, and is below a second beam splitter 9. The alignment radiation output 5 is configured to provide a beam of non-actinic radiation (e.g. visible radiation) which is directed by the second beam-splitter 9 and the beam-splitter 3, towards the imprint template 21 and substrate 20. A detector 6 is located adjacent to one side of the second beam splitter 9. The detector 6 is configured to receive alignment radiation which is reflected from the substrate 20 and imprint template 21 (the reflected radiation being reflected via the beam-splitter 3 and passing through the second beam-splitter 9). First and second lock-in detectors 7, 8 are connected to an output of the detector 6.

Figure 3A:
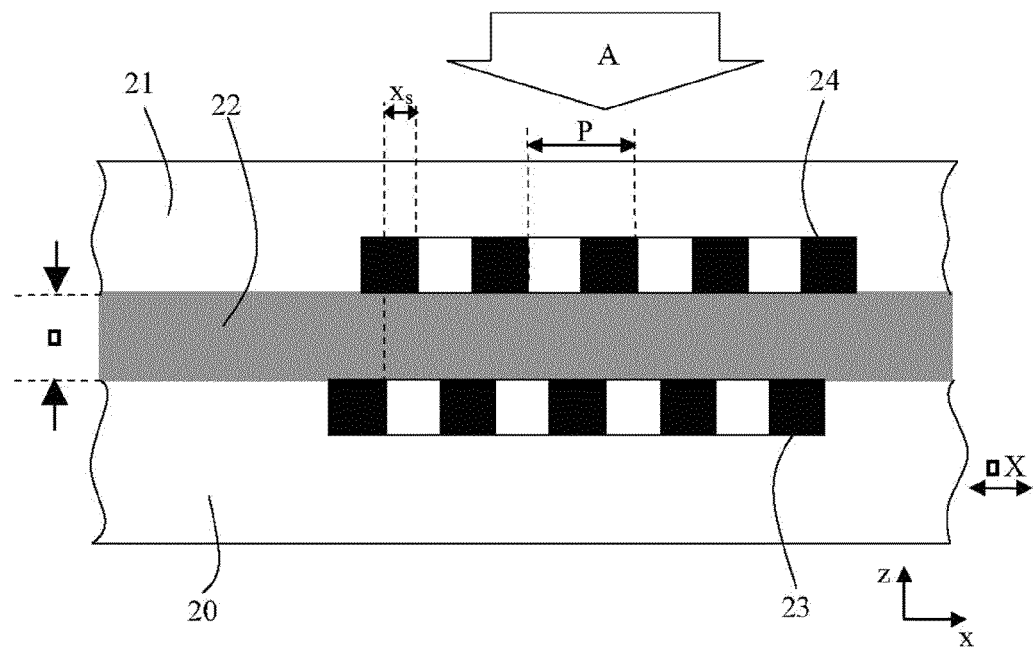
FIG. 3 schematically shows determination of an offset between an imprint template and a substrate according to an embodiment of the invention.

FIG. 3a shows schematically in cross-section part of the substrate 20 and part of the imprint template 21. The imprint template 21 is located above the substrate 20, and imprintable medium 22 is provided between the imprint template 21 and the substrate 20. The imprint template is provided with a pattern (not shown) which will be imprinted into the imprintable medium 22. The imprintable medium 22 will then be cured by exposure to actinic radiation, thereby providing a pattern on the substrate 20.

It is desirable to align the imprint template 21 and the substrate 20. This will help to ensure that a pattern imprinted onto the substrate 20 is aligned with one or more patterns previously imprinted onto the substrate.

The substrate 20 is provided with an alignment mark 23 which comprises a diffraction grating that extends in the x-direction. This alignment mark is hereafter referred to as the substrate alignment grating 23. The imprint template 21 is provided with an alignment mark 24 which also comprises a diffraction grating that extends in the x-direction. This alignment mark is hereafter referred to as the imprint template alignment grating 24. The substrate alignment grating 23 and the imprint template alignment grating 24 both have a constant grating period. The substrate alignment grating 23 and the imprint template alignment grating 24 both have the same grating period P. The imprint template alignment grating 24 is offset by an amount $x_s$ relative to the substrate alignment grating 23 (i.e. the imprint template is misaligned by $x_s$, relative to the substrate, in this example).

Cartesian coordinates are shown in FIG. 3a in order to facilitate explanation of that figure. The Cartesian coordinates follow lithographic convention, with the x and y directions being in the plane of the substrate, and the z-direction being perpendicular to the plane of the substrate. The Cartesian coordinates are not intended to imply that the substrate or the imprint template must have any specific orientation.

In order to achieve alignment of the substrate 20 and imprint template 21, an alignment radiation beam A is directed towards the alignment gratings 23, 24. The alignment radiation beam A is formed from non-actinic radiation, and so does not cause curing of the imprintable medium 22. As shown in FIG. 2, the alignment radiation beam A is generated by the alignment radiation output 5.

The position of the substrate 20 is modulated in the x-direction by an amount ΔX, as is indicated in FIG. 3a. The modulation of the substrate position, which is achieved by modulating the position of the substrate table WT, occurs while the alignment radiation beam A is being directed towards the alignment gratings 23, 24.

The detector 6 shown in FIG. 2 is used to detect the intensity of radiation that is reflected from the alignment gratings 23, 24 ($0^{th}$ order reflected radiation). The intensity of the radiation reflected by the imprint template alignment grating 24 and the substrate alignment grating 23 depends upon their positions relative to one another. The imprint template alignment grating 24 and the substrate alignment grating 23 may be considered together to form a composite grating. The term 'composite grating' may be interpreted as meaning two gratings which are configured such that a substantial portion of radiation diffracted by one of the gratings is incident upon the other grating. The amount of radiation which is reflected by the composite grating depends upon the degree to which the imprint template alignment grating 24 and the substrate alignment grating 23 are aligned.

The pitch of the alignment gratings 23, 24 may be of the same order as the wavelength of the alignment radiation beam, and as a result the physics which governs the reflection of radiation by the composite grating is complicated. In order to aid an intuitive understanding of an embodiment of the invention, the following is a simplified explanation based on geometrical optics: Reflective lines of the substrate alignment grating 23 will reflect alignment radiation A towards the detector 6, in addition to reflective lines of the imprint template alignment grating 24. The amount of radiation which is reflected by the substrate alignment grating 23 and the imprint template alignment grating 24 will depend upon the extent to which the substrate alignment grating 23 is aligned with the imprint template alignment grating 24. If the imprint template alignment grating 24 and the substrate alignment grating 23 are positioned such that lines of the substrate alignment grating are located directly beneath lines of the imprint template alignment grating, then little of the alignment radiation beam A will be reflected from the substrate alignment grating. This is because the alignment radiation A which passes between reflective lines of the imprint template alignment grating 24 will not be incident upon reflective lines of the substrate alignment grating 23, but will instead pass between those lines without a significant proportion of the radiation being reflected. At the opposite extreme, if the substrate alignment grating 23 were to be positioned such that it was out of phase with the imprint template alignment grating 24 (i.e. such that lines of the substrate alignment grating lie beneath gaps of the imprint template alignment grating), then alignment radiation A which passed between lines of the imprint template alignment grating 24 would be incident upon lines of the substrate alignment grating 23. A substantial amount of alignment radiation A would therefore be reflected by the substrate alignment grating 23.

The physics which governs the reflection of alignment radiation by the composite grating formed by the imprint template alignment grating 24 and the substrate alignment grating 23 is more complex than that described above. However, the effect is the same—namely that the amount of radiation which is reflected from the composite grating depends upon the extent to which the substrate alignment grating 23 is aligned with the imprint template alignment grating 24.

The detector 6 (see FIG. 2) is positioned such that it receives $0^{th}$ order radiation which is reflected back from the composite grating formed by the imprint template alignment grating 24 and the substrate alignment grating 23. The detector 6 detects the intensity of the $0^{th}$ order reflected radiation. The intensity of the $0^{th}$ order reflected radiation will vary periodically in the x-direction with a period P (the period P corresponds with the pitch of the imprint template alignment grating 24 and the substrate alignment grating 23).

The intensity of the back-reflected $0^{th}$ order radiation may be expressed as:

$$I_0 = A_0 + A_1 \cos\left(2\pi \frac{x_s}{P}\right) + A_2 \cos\left(4\pi \frac{x_s}{P}\right) + \ldots + A_n \cos\left(2n\pi \frac{x_s}{P}\right) \quad (1)$$

where $I_0$ is the intensity of the $0^{th}$ order back-reflected intensity, $x_s$, is the offset between the imprint template alignment grating 24 and substrate alignment grating 23 (i.e. the alignment error), and P is the pitch of the imprint template alignment grating and substrate alignment grating. $A_1$, $A_2$, $A_3 \ldots A_n$ are constants which depend on properties of the alignment gratings, properties of the imprintable medium 22 and the substrate, the distance in the z-direction between the template and the substrate, and the wavelength and polarization of the alignment radiation.

It may be assumed that the alignment gratings are weakly diffracting gratings with a small pitch, and hence the higher order terms of equation (1) can be ignored. Equation (1) is then approximated by:

$$I_0 = A_0 + A_1 \cos\left(2\pi \frac{x_s}{P}\right) \quad (2)$$

Since the values of $A_0$ and $A_1$ depend upon various properties, as explained above, it cannot be assumed that they have particular values. For example, the depth of the substrate alignment grating 23 may be modified during processing of the substrate 20, and this may change the values of $A_0$ and $A_1$. The values of $A_0$ and $A_1$ are therefore unknown. Consequently a single measurement of the intensity of the $0^{th}$ order back-reflected intensity is not sufficient to determine the offset $x_s$ between the imprint template alignment grating 24 and substrate alignment grating 23.

The modulation of the position of the substrate 20 in the x-direction allows the offset $x_s$ to be determined. The modulation may be a sinusoidal modulation with a frequency $\Omega$ and an amplitude $\Delta X$. As a result of the sinusoidal modulation, the intensity of the $0^{th}$ order back-reflected intensity is modified to:

$$I_0 = A_0 + A_1 \cos\left(2\pi \frac{x_s}{P} + 2\pi \frac{\Delta X}{P} \sin(\Omega t)\right) \quad (3)$$

This can be expressed as a Fourier series. The first 3 terms of the Fourier series are:

$$I_0 = A_0 + A_1 \sin\left(2\pi \frac{x_s}{P}\right) J_1\left(2\pi \frac{\Delta X}{P}\right) \cos(\Omega t) + \quad (4)$$
$$A_1 \cos\left(2\pi \frac{x_s}{P}\right) J_2\left(2\pi \frac{\Delta X}{P}\right) \cos(2\Omega t)$$

where $J_{1,2}$ are Bessel functions of the first kind. The amplitude of the first harmonic term may be measured using the first lock-in detector 7 which receives output from the detector 6. Similarly, the amplitude of the second harmonic term may be measured using the second lock-in detector 8. The amplitudes $B_1$ and $B_2$ of, respectively, the $1^{st}$ and $2^{nd}$ harmonics are given by:

$$B_1 = A_1 \sin\left(2\pi \frac{x_s}{P}\right) J_1\left(2\pi \frac{\Delta X}{P}\right) \quad (5a)$$

$$B_2 = A_1 \cos\left(2\pi \frac{x_s}{P}\right) J_2\left(2\pi \frac{\Delta X}{P}\right) \quad (5b)$$

Once the amplitudes $B_1$ and $B_2$ have been measured using the lock-in detector, there are two unknowns: $A_1$ and $x_s$. Since there are two equations (5a,5b), the offset $x_s$ can be determined.

The solution becomes particularly simple if $2\pi\Delta X/P=2.63$. This condition may be met by selecting an appropriate amplitude $\Delta X$ for the sinusoidal modulation in relation to the pitch P of the alignment gratings 23, 24. When $2\pi\Delta X/P=2.63$, then $J_1=J_2=0.46$ (this is a property of Bessel functions). This yields the following expression:

$$B_1 = 0.46 A_1 \sin\left(2\pi \frac{x_s}{P}\right) \quad (6a, 6b)$$

$$B_2 = 0.46 A_1 \cos\left(2\pi \frac{x_s}{P}\right)$$

The offset $x_s$ is then given by:

$$x_s = \frac{P}{2\pi} a\tan\left(\frac{B_1}{B_2}\right) \quad (7)$$

The offset $x_s$ of the imprint template 21 relative to the substrate 20 may be determined by modulating the position of the substrate in the x-direction, measuring the amplitudes of the first and second harmonics of the resulting back-reflected alignment radiation, and performing the calculation of equation (7).

Figure 3B:
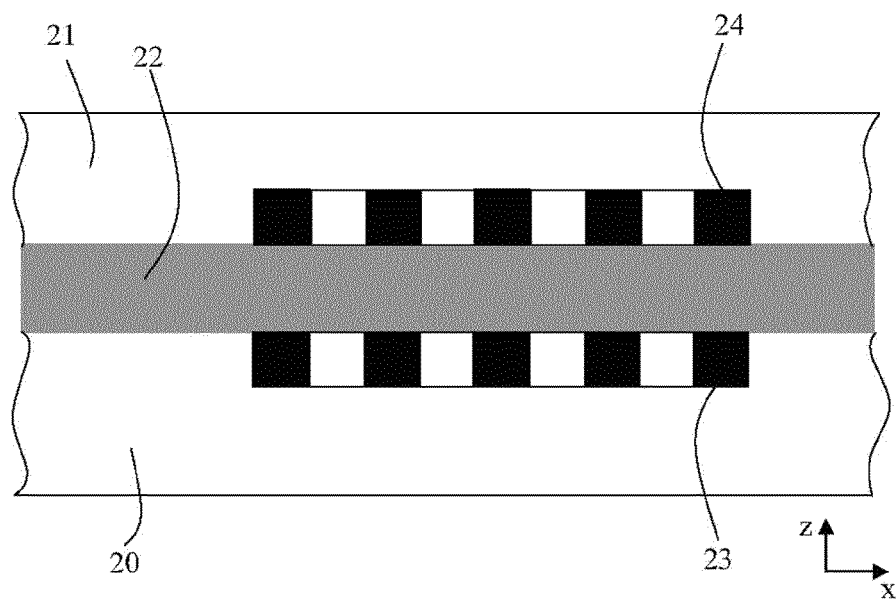

Once the offset $x_s$ has been determined, the imprint template 21 may be moved in the x-direction in order to reduce the offset $x_s$ to zero. This is shown in FIG. 3b, where the offset $x_s$ is zero and the imprint template 21 and substrate 20 are aligned relative to one another in the x-direction.

In the above mathematical treatment, it was assumed that the alignment gratings were weakly diffracting gratings with a small pitch, such that the higher order terms of equation (1) could be ignored. However, it is not necessary that this assumption be made. If the assumption is not made, then there are more Bessel function terms in equation (4), and calculation of the offset $x_s$ is more complex. This more complex calculation may nevertheless be performed using known techniques.

Although the particular solution mentioned above utilizes a modulation amplitude $\Delta X$ such that $2\pi\Delta X/P=2.63$, other modulation amplitudes may be used. The resulting calculation of the offset $x_s$ is more complex, but may be performed using known techniques.

As mentioned above, the amplitudes $B_1$ and $B_2$ of the $1^{st}$ and $2^{nd}$ harmonics are measured using lock-in detectors 7, 8. Lock-in detection techniques are inherently low-noise. Consequently, the amplitudes $B_1$ and $B_2$ may be determined with an excellent signal-to-noise ratio.

Detection apparatus other than lock-in detectors may be used to measure the $B_1$ and $B_2$ of the $1^{st}$ and $2^{nd}$ harmonics (including using other detection techniques).

The alignment gratings 23, 24 may for example have a grating pitch P=500 nm. The amplitude of the sinusoidal modulation $\Delta X$ may be 210 nm (this satisfies the condition $2\pi\Delta X/P=2.63$ mentioned above). The alignment radiation beam A may for example have a wavelength of 633 nm.

The alignment gratings 23, 24 may for example have a grating pitch selected from the range of 300 nm to 2000 nm. The alignment radiation beam A may for example have a wavelength selected from the range of 400 nm to 1100 nm. The pitch of the gratings should be sufficiently long that non-zero diffraction orders propagate between the imprint template alignment grating 24 and the substrate alignment grating 23 (taking into account the wavelength of the alignment radiation beam and the refractive index of the imprintable medium). For example, if the refractive index of the imprintable medium is n=1.5, and the wavelength of the alignment radiation beam is 400 nm, then the pitch should be 267 nm or greater (400/1.5=267 nm).

The amplitude of the sinusoidal motion may for example be selected from the range of 50 nm to 1000 nm.

More than one wavelength of alignment radiation may be used. Different wavelengths of alignment radiation may provide different strengths of intensity modulation at the detector 6 (for example arising from variation from substrate to substrate of the depth of the substrate alignment grating 23 due to substrate processing). Where more than one wavelength is used, the wavelength which provides the strongest detected intensity may for example be selected as the wavelength which is used to determine the offset $x_s$.

Different wavelengths may be generated sequentially (e.g. by tuning a tunable radiation source to different desired wavelengths), or in parallel. If the different wavelengths are generated in parallel, then a wavelength demultiplexer (e.g. a spectrometer) may be used at the detector to distinguish between wavelengths.

The alignment method is relatively tolerant with respect to inaccuracies arising when the method is applied. For example, a small error in the amplitude of the modulation will lead to a small scaling error in the measured offset $x_s$. The scaling error may be made less than or equal to 10%, or even less than or equal to 1%. Consequently, it may be possible to determine a measured offset of 10 nm for example with an error of 1 nm, or an error of 0.1 nm.

As mentioned further above, the modulation of the position of the substrate $\Delta X$ may be sinusoidal. If the modulation is for example not a perfect sine-wave, or if the variation of detected radiation intensity is not a perfect cosine, this will give rise to scaling errors in the measured offset $x_s$. The scaling error may be dealt with by using an iterative alignment scheme. For example, a 10% scaling error may occur. This will cause an offset $x_s$ of 10 nm to be measured as an offset of 11 nm. The measured 10 nm offset may be corrected by moving the substrate by 10 nm. There will be a 1 nm residual error, i.e. an offset of 1 nm. This will also be measured with a 10% scaling error, i.e. as an offset of 0.9 nm. The residual error will then be 0.1 nm.

In the described embodiment it has been assumed that an offset $x_s$ of zero corresponds to the desired position of the substrate 20 relative to the imprint template 21. However, in some instances the desired position of the substrate 20 relative to the imprint template 21 may correspond to a non-zero offset $x_s$.

Figure 4:
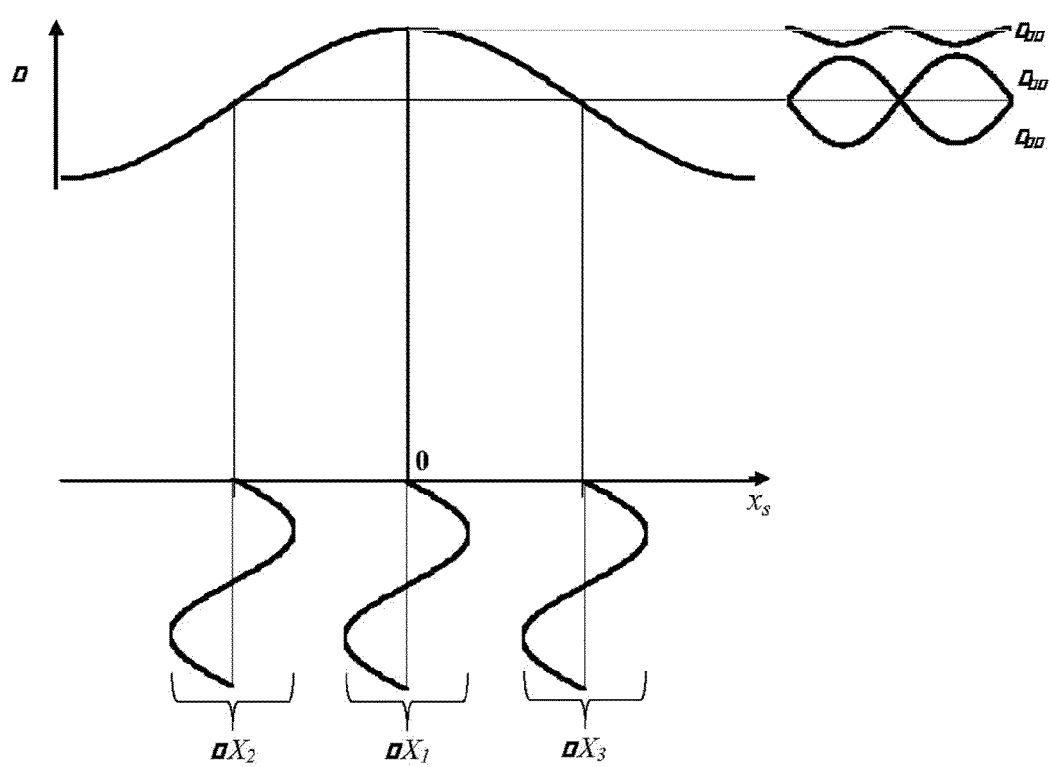
FIG. 4 is a graph which illustrates operation of an embodiment of the invention.

FIG. 4 shows diagrammatically how the modulation of the position of the imprint template affects the intensity of the back-reflected $0^{th}$ order intensity. The long curve at the top of FIG. 4 shows the intensity $I_0$ that would be seen if no modulation were to be applied. It can be seen that when the offset $x_s$ between the imprint template and the substrate is zero, then the back-reflected intensity $I_0$ is at a maximum. As the offset $x_s$ moves away from zero (either in the positive x-direction or negative x-direction), the intensity $I_0$ of the back-reflected radiation reduces as a cosine function of the offset. In some instances, the back-reflected intensity $I_0$ may be at a minimum rather than a maximum when the offset $x_s$ is zero (this is the situation in the simplified explanation based on geometrical optics which is given further above). Whether the back-reflected intensity $I_0$ is at a minimum or a maximum for a zero offset $x_s$ depends on the sign of $A_1$ (see equation 1). This may depend upon parameters such as the wavelength of the alignment radiation, and the separation between the imprint template and the substrate.

The bottom of FIG. 4 shows schematically the sinusoidal modulation $\Delta X$ which is applied to the substrate 20. The sinusoidal modulation $\Delta X$ is shown for three different offsets $x_s$, the modulations being shown as $\Delta X_1$, $\Delta X_2$ and $\Delta X_3$. The modulations $\Delta X_1$, $\Delta X_2$ and $\Delta X_3$ start at the bottom of FIG. 4 and move upwards.

In a first example, the offset $x_s$ between the imprint template and the substrate is zero. The sinusoidal modulation $\Delta X_1$ gives rise to modulated intensity $I_{01}$ shown in the top right hand corner of FIG. 4 (this modulation moves from left to right in FIG. 4). As can be seen from FIG. 4, since the modulation is applied at a maximum of the intensity curve $I_{01}$ the resulting modulated intensity $I_{01}$ has a frequency which is twice the frequency of the sinusoidal modulation $\Delta X_1$.

In a second example, the offset is a negative x-value. The sinusoidal modulation $\Delta X_2$ gives rise to modulated intensity $I_{02}$ shown in the top right hand corner of FIG. 4. The modulated intensity $I_{02}$ has the same frequency as the sinusoidal modulation $\Delta X_2$.

In a third example, the offset is a positive x-value. The sinusoidal modulation $\Delta X_3$ gives rise to modulated intensity $I_{03}$ shown in the top right hand corner of FIG. 4. As can be seen from FIG. 4, the modulated intensity $I_{03}$ has the same frequency as the sinusoidal modulation $\Delta X_3$. However, the modulated intensity has an opposite phase from the modulated intensity $I_{02}$ of the second example.

FIG. 4 demonstrates using curves that a comparison of the amplitudes of the first and second harmonics of the modulated intensity detected by the detector 6 may be used to determine the offset $x_s$. This is also demonstrated by equation (7).

The above example has described how to determine the offset in the x-direction. In order to determine the offset in the y-direction, alignment gratings which extend in the y-direction may be used, together with a modulation which is applied in the y-direction.

Figure 5A:
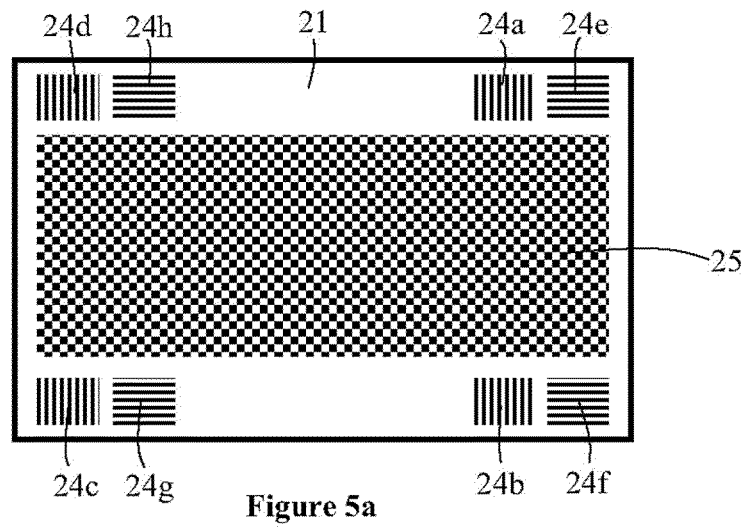
FIG. 5 schematically shows two imprint templates according to an embodiment of the invention.

FIG. 5a shows schematically, viewed from above, an imprint template 21 which is provided with four alignment gratings 24a-d which extend in the x-direction, and four alignment gratings 24e-h which extend in the y-direction. The alignment gratings are provided adjacent to corners of a patterned region 25 of the imprint template. Correspondingly arranged alignment gratings may be provided on a substrate (not shown). The imprint template may be aligned to the substrate, both in the x-direction and the y-direction, in the manner described above.

Alignment gratings may be provided at positions which are different from those shown in FIG. 5a. More or less than four alignment gratings may be provided. One or more alignment gratings may be provided within the patterned region.

The offset of a given imprint template alignment grating (e.g. 24a) relative to a substrate alignment grating may be determined using an alignment radiation beam in the manner described above. Once this has been done, the alignment radiation beam may be directed towards a different imprint template alignment grating (e.g. 24b), and the offset of that imprint template alignment grating relative to an associated substrate alignment grating may be determined. This may be repeated until the offsets of each of the imprint template alignment gratings 24a-h relative to an associated substrate alignment grating has been determined. The aligned position of the imprint template 21 relative to the substrate may then be calculated based upon the offsets.

In an embodiment, the offsets of a plurality of imprint template alignment gratings relative to associated substrate alignment gratings may be determined in parallel. This may be achieved for example by providing a plurality of sources of alignment radiation 5 and associated detectors 6. In an embodiment, the offsets of two imprint template alignment gratings may be determined, following which the offsets of two different imprint template alignment gratings are determined, etc. In an embodiment, the offsets of all of the imprint template alignment gratings may be determined in parallel.

In principle, it is possible to determine the aligned position of the imprint template 21 relative to a substrate using a single imprint template alignment grating 24a which extends in the x-direction and a single imprint template alignment grating 24e which extends in the y-direction. However, such an arrangement would not allow the orientation of the substrate to be determined (e.g. rotation of the substrate), scaling of the substrate to be determined (e.g. due to thermal expansion), etc. Providing imprint template alignment gratings 24a-h for each measurement direction at each corner of the imprint template allows the substrate orientation, scaling, etc to be determined.

Any number of imprint template alignment marks may be provided.

Although the alignment gratings are described as extending in the x-direction and the y-direction, they may extend in any direction.

In the above examples, the modulation has been parallel to the direction of an alignment grating. However, the modulation may be at an angle relative to an alignment grating. The modulation may for example be in any direction which is substantially parallel to the surface of the substrate. The modulation may for example be in any direction which is substantially parallel to the surface of the substrate table. The modulation may for example be in any direction which is substantially parallel to a lowermost surface of the imprint template. The orientation of the alignment gratings may be such, relative to the direction of modulation, that they give rise to a measurable modulation of the back-reflected alignment radiation.

Figure 5B:
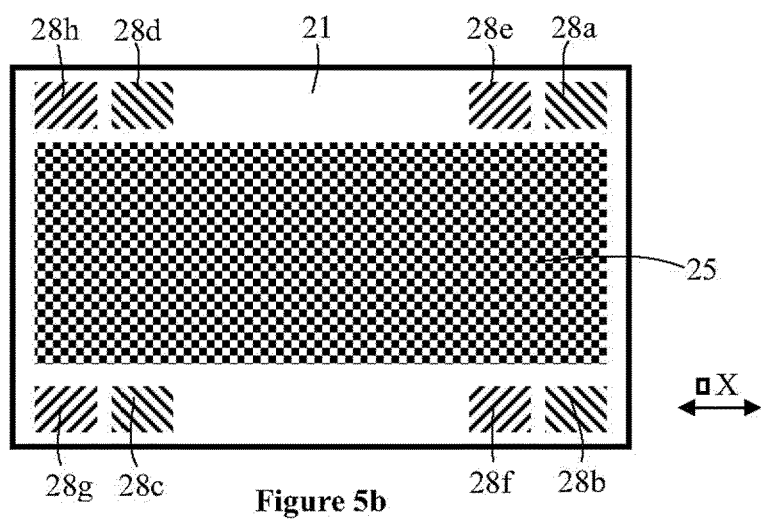

FIG. 5b shows schematically, viewed from above, an imprint template 21 which is provided with an alternative arrangement of alignment gratings. Four alignment gratings 28a-d extend in a direction x=y, and four alignment gratings 28e-h extend in a direction x=−y. Correspondingly arranged alignment gratings may be provided on a substrate (not shown).

The position of the substrate may be modulated in the x-direction, as shown by the double headed arrow $\Delta X$. Since the gratings are at an angle of 45° relative to the direction of modulation, the amplitude of the modulation may be increased by a factor of $\sqrt{2}$ in order to satisfy the condition $2\pi\Delta X/P=2.63$ which is mentioned further above. The modulation may for example have an amplitude of 300 nm.

Measurement of the position of the first imprint template alignment grating 28a and associated substrate alignment grating will determine the offset of the imprint template relative to the substrate in the direction x=y. Measurement of the position of the adjacent imprint template alignment grating 28e and associated substrate alignment grating will determine the offset of the imprint template relative to the substrate in the direction x=−y. Thus, the offset of the imprint template relative to the substrate is determined in two transverse directions. This is achieved while modulating the substrate in only one direction (the x-direction in this example).

The aligned position of the substrate relative to the imprint template may be determined using modulation in a single direction. Alternatively, the aligned position of the substrate relative to the imprint template may be determined using modulation in two directions.

If a grating were to extend at a different angle relative to the direction of modulation, then the amplitude of the modulation may be selected such that the condition $2\pi\Delta L/P=2.63$ is satisfied, where $\Delta L$ is the amplitude of the modulation, and P is the pitch of the imprint template alignment grating measured in the direction of the modulation.

The alignment gratings may extend parallel to a direction of modulation, or at an angle relative to a direction of modulation. The angle subtended by an alignment grating relative to the modulation direction is not 90° when that alignment grating is being used to determine the offset (although it may be 90° when a different alignment grating is being used to determine the offset).

The alignment gratings may extend in transverse directions. The alignment gratings may extend in directions which are not transverse.

As mentioned above, the offset of a given imprint template alignment grating relative to an associated substrate alignment grating may be measured by directing an alignment radiation beam towards that imprint template alignment grating. Referring to FIG. 2, the alignment radiation beam may be directed for example by the second beam-splitter 9, which may have an adjustable orientation. The orientation of the second beam-splitter 9 may be controlled by a controller (not illustrated). Any other suitable apparatus may be used to direct the alignment radiation beam towards different imprint template alignment gratings.

In an arrangement, a separate alignment radiation beam generated by a different source may be used for each imprint template alignment grating.

In order to avoid unwanted harmonics being generated by an edge of an alignment grating, the cross-sectional size of the alignment radiation beam may be sufficiently small that it falls fully within each imprint template alignment grating.

Each alignment grating may for example measure 80 μm by 80 μm, or 40 μm by 40 μm, or may have some other suitable size. The alignment radiation beam may for example have a cross-sectional size of 20-30 μm, or some other suitable cross-sectional size.

The area on the imprint template (and substrate) occupied by alignment gratings may be smaller than the area occupied by alignment gratings used for other alignment methods. For example, the area occupied by alignment gratings may be smaller than would be the case if multiple alignment gratings were needed for each offset measurement. The area occupied by alignment gratings may be smaller than would be the case if a linear scanning movement of the type seen in conventional optical lithographic apparatus was needed for each offset measurement. In this context linear scanning movement is intended to mean scanning a spot of alignment radiation over a multiplicity of lines of a diffraction grating. A linear scanning movement is not needed by embodiments of the invention, and consequently less area on the imprint template (and substrate) may be occupied by alignment gratings. More area is therefore available for pattern features.

As mentioned above, the modulation of the position of the substrate may be achieved by modulating the position of the substrate table WT. The position of the substrate table WT may be modulated, for example, using a piezo-electric actuator. The piezo-electric actuator may, for example, be connected between the positioning device PW and the substrate table WT. Alternatively, the position of the positioning device PW itself may be modulated.

The substrate table WT may, for example, be mounted on a resonant flexure stage which may be used to modulate the position of the substrate table. A resonant flexure stage is a moving mass that is suspended on flexure springs. Since it is a mass-spring system, it has a well defined resonance frequency at which it may be driven using a relatively low mechanical driving energy. The resonant flexure stage may, for example, be configured such that it has a resonance frequency which corresponds to a desired frequency of modulation.

In an arrangement, the position of the imprint template 21 may be modulated instead of, or in addition to, the position of the substrate. This may be achieved by modulating the position of the imprint template holder 1, for example by using a piezo-electric actuator.

The frequency of the modulation may, for example, be selected from the range 10 Hz to 1 kHz. The frequency of the modulation may, for example, depend on the mass of apparatus which is being modulated (e.g. a larger mass may be modulated at a lower frequency than a smaller mass).

Although the modulation is described as being sinusoidal in the above example, other modulations may be used. For example, a saw-tooth shaped modulation, a square-wave modulation, or any other modulation may be used. The calculation of the offset $x_s$ may be modified in order to take into account the form of modulation that is used. For example, the third harmonic and possibly additional harmonics may be included in the calculation.

The imprint template alignment grating 24 and the substrate alignment grating 23 should have a pitch which is sufficiently large to allow non-zero diffraction orders to propagate between the gratings (the term 'non-zero diffraction orders' in this context refers to diffraction orders other than the zero order). If the pitch were to be too small then non-zero diffraction orders formed by the imprint template alignment grating 24 would fall outside of the substrate alignment grating 23.

The imprint template alignment grating 24 and the substrate alignment grating 23 may include some sub-segmentation. A grating which does not include sub-segmentation consists of alternating lines and spaces (e.g. as shown in FIG. 3). A grating which includes sub-segmentation may include a periodic pattern provided within each line and/or within each space.

In above described embodiments the imprint template alignment grating 24 and the substrate alignment grating 23 have the same pitch. However, the imprint template and the substrate alignment grating may have different pitches. For example, the pitch of the imprint template alignment grating may be two times, three times, or n times (where n is an integer) greater than the pitch of the substrate alignment grating. In an alternative example, the pitch of the substrate alignment grating may be two times, three times, or n times (where n is an integer) greater than the pitch of the imprint template alignment grating.

A gap 'Z' is labeled in FIG. 3 between a lowermost surface of the imprint template 21 and an uppermost surface of the substrate 20. Although the gap Z is filled with imprintable medium 22, it may instead merely contain gas (for example if imprintable medium is not provided between alignment gratings but instead is only provided beneath the patterned region

25 (see FIG. 5). The size of the gap Z may be such that alignment radiation transmitted by the imprint template alignment grating 24 starts diverging, but the diverging alignment radiation falls completely (or mostly) on the substrate alignment grating 23. The size of the gap may be dictated by aspects of imprint lithography such as the amount of imprintable medium 22 which is present. The gap Z may be in the range 1-2 microns. The gap may be several microns. The gap may be less than 1 micron, and may be less than 100 nm. The gap may for example be between 10 nm and 20 nm.

Initial alignment (coarse alignment) of the substrate (or imprint template) with respect to the imprint template (or the substrate) should be within the capture range provided by the alignment gratings 23, 24. The term 'capture range' is intended to mean the range of misalignments from the aligned position over which alignment can be achieved using the alignment gratings. The capture range of an embodiment of the invention is less than the pitch of the alignment gratings. The capture range is approximately a quarter of the pitch of the alignment gratings 23, 24. This link between the capture range and the grating pitch may influence the grating pitch which is used. A smaller grating pitch may require a higher accuracy of coarse alignment, in order to ensure that the coarse alignment aligns the alignment gratings within the capture range.

Alignment gratings with different pitches may be provided. Alignment gratings with coarse pitches may be used to provide coarse alignment, and alignment gratings with fine pitches may be used to provide fine alignment.

Since the imprint template 21 is in contact with the imprintable medium 22, the modulation of the substrate will cause frictional force to arise between the imprint template and the imprintable medium. This will cause energy to be delivered into the imprintable medium. The time period during which the modulation is applied, and the frequency of the modulation, may be selected such that the amount of energy which is delivered into the imprintable medium is sufficiently small that it does not cause unwanted modification of the imprintable medium to Occur.

In one example, the frictional force may be assumed to be 20 mN. The frequency of the modulation may be 100 Hz, and the time period during which the modulation is applied may be 1 second. The amplitude of the modulation may be 300 nm. This provides 100 modulations, thereby giving a traveled path length of around 4*300 nm*100=0.12 mm. This gives an energy due to friction of 0.12 mm*20 mN=2.4 µJ. This may be sufficiently small that it does not cause unwanted modification of the imprintable medium to occur. It may be sufficiently small that it does not cause the shape of the substrate or the imprint template to change due to heating arising from friction.

The alignment method does not require that individual lines of the alignment gratings are resolved. Consequently, the numerical aperture of the optics can be kept relatively small, for example in the range of 0.1 to 0.2. This allows optics to be designed which occupy a small volume. Moreover, the alignment apparatus may use relatively low cost optics, and may therefore be less expensive than some other alignment apparatus.

Above described embodiments of the invention are based upon detection of the intensity modulation of $0^{th}$ order back-reflected radiation. However, properties other than intensity may be measured. For example, modulation of the polarization state of the $0^{th}$ order back-reflected radiation may be measured (misalignment between gratings may change the polarization state of back-reflected radiation). The polarization state of the radiation may, for example, be measured using ellipsometry or polarimetry methods, or any other suitable method.

Intensity and polarization are examples of properties of the back-reflected radiation which may be detected by embodiments of the invention.

Embodiments of the invention may detect non-zero orders of back-reflected radiation. Where this is done for a given diffraction order 'n', a pair of diffraction orders 'n' and '−n' are detected (rather than detecting only a single diffraction order 'n'). This is done because a spurious phase shift may be present in the detected back-reflected radiation, the phase shift arising from processing of the substrate which may have caused the substrate alignment grating to become asymmetric. The spurious phase shift will have opposite signs for the 'n' and '−n' orders, and can therefore be removed from the detected signal by comparing the detected 'n' and '−n' orders. In order to detect the 'n' and '−n' orders, the detector 6 (see FIG. 2) may be replaced with a pair of detectors.

The imprint template may imprint a target portion of the substrate (as shown in FIG. 2). Where this is the case, the imprint template is removed from an imprinted part of the substrate once it has been imprinted, and is used to imprint a different part of the substrate. This is repeated until all desired parts of the substrate have been imprinted. Alignment gratings may be provided at each target portion of the substrate, in order to allow the imprint template to be aligned to each target portion as required.

More than one imprint template may be provided in the lithographic apparatus. For example, the aligned position of a first imprint template relative to the substrate may be determined at the same time that curing of imprintable medium beneath a second imprint template is taking place. Where this is the case, the first imprint template may be modulated rather modulating the substrate, to avoid damaging a pattern which is being imprinted by the second imprint template.

Where more than one imprint template is provided, the aligned position of each imprint template may be determined separately (e.g. sequentially). Alternatively, the aligned position of each imprint template may be determined together.

In the above embodiments, a single imprint template, a single imprint template holder, a single substrate holder and a single substrate is provided in a single chamber. In other embodiments, more than one imprint template, more than one imprint template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint template arrangements. In an embodiment, there is provided an apparatus configured to use one imprint template holder arrangement per substrate holder. In an embodiment, there is provided an apparatus configured to use more than one template holder arrangement per substrate holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint template arrangement. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

Although described embodiments of the invention use UV imprint lithography, the invention may use other forms of imprint lithography such as for example hot imprint lithography.

Although the imprint template has been described as being above the substrate, the imprint template and the substrate may have any orientation (e.g. the substrate may be above the imprint template).

Embodiments of the invention are provided in below numbered clauses:

1. A method of determining an offset between an imprint template and a substrate, using a first alignment grating on the imprint template and a first alignment grating on the substrate, the method comprising:
    bringing the first imprint template alignment grating and the first substrate alignment grating sufficiently close together that they form a composite grating;
    directing an alignment radiation beam at the composite grating while modulating a relative position of the imprint template and the substrate;
    detecting a property of alignment radiation which is reflected from the composite grating; and
    determining the offset by analyzing modulation of the detected property arising from the modulation of the relative position of the imprint template and the substrate.
2. The method of clause 1, wherein the detected property of the alignment radiation is intensity of the alignment radiation.
3. The method of clause 1, wherein the detected property of the alignment radiation is a polarization state of the alignment radiation.
4. The method of any preceding clause, wherein the reflected alignment radiation which is detected is $0^{th}$ order back-reflected alignment radiation.
5. The method of any preceding clause, wherein analyzing modulation of the detected property comprises analyzing first and second harmonics of the modulated detected property.
6. The method of any preceding clause, wherein the first imprint template alignment grating extends in a direction which is parallel to the direction of modulation of the relative position of the imprint template and the substrate.
7. The method of any of clauses 1 to 5, wherein the first imprint template alignment grating extends in a direction which is at an angle with respect to the direction of modulation of the relative position of the imprint template and the substrate.
8. The method of any preceding clause, wherein the amplitude of the relative position modulation lies within a range of 50 nm to 1000 nm.
9. The method of any preceding clause, wherein the relative position modulation has a frequency which lies within a range of 10 Hz to 1 kHz.
10. The method of any preceding clause, wherein the pitch of the first imprint template alignment grating and the pitch of the first substrate alignment grating lies in the range of 300 nm to 2000 nm.
11. The method of any preceding clause, wherein the relative position modulation arises from modulation of the position of the substrate.
12. The method of any preceding clause, wherein the relative position modulation is sinusoidal.
13. The method of clause 12, wherein the relative position modulation satisfies the condition $2\pi\Delta L/P=2.63$, where $\Delta L$ is the amplitude of the relative position modulation, and P is the pitch of the first imprint template alignment grating measured in the direction of the relative position modulation.
14. The method of any preceding clause, repeated for a second imprint template alignment grating and a second substrate alignment grating in order to determine a second offset, the method further comprising using the first offset and the second offset to achieve an alignment of the substrate and the imprint template.
15. The method of clause 14, wherein the method for the first imprint template alignment grating and the first substrate alignment grating, and the method for the second imprint template alignment grating and the second substrate alignment grating are performed simultaneously.
16. The method of clause 14 or clause 15, wherein the first imprint template alignment grating and the second imprint template alignment grating extend in transverse directions.
17. The method of any of clauses 14 to 16, wherein the relative position of the imprint template and the substrate is modulated in a single direction during determination of the first and second offsets.
18. An imprint lithography apparatus, comprising:
    a substrate table configured to hold a substrate;
    an imprint template holder configured to hold an imprint template;
    a detector configured to detect a property of alignment radiation reflected from the imprint template and the substrate; and
    an actuator configured to modulate a relative position of the substrate table and the imprint template holder.
19. The apparatus of clause 18, wherein the detector is configured to measure intensity of the alignment radiation.
20. The apparatus of clause 18, wherein the detector is configured to measure a polarization state of the alignment radiation.
21. The apparatus of any of clauses 18 to 20, further comprising a lock-in detector configured to monitor a modulation harmonic of the detected alignment radiation property.
22. The apparatus of any of clauses 18 to 21, wherein the actuator is configured to modulate the relative position of the substrate table and the imprint template holder by a distance which lies in the range of 50 nm to 1000 nm.

The invention claimed is:

1. A method of determining an offset between an imprint template and a substrate, using a first alignment grating on the imprint template and a first alignment grating on the substrate, the method comprising:
    bringing the first imprint template alignment grating and the first substrate alignment grating sufficiently close together that they form a composite grating;
    directing an alignment radiation beam at the composite grating while oscillating a relative position of the imprint template and the substrate;
    detecting a property of alignment radiation which is reflected from the composite grating; and
    determining the offset by analyzing oscillation of the detected property arising from the oscillation of the relative position of the imprint template and the substrate.

2. The method of claim 1, wherein the detected property of the alignment radiation is intensity of the alignment radiation.

3. The method of claim 1, wherein the detected property of the alignment radiation is a polarization state of the alignment radiation.

4. The method of claim 1, wherein the reflected alignment radiation which is detected is $0^{th}$ order back-reflected alignment radiation.

5. The method of claim 1, wherein analyzing oscillation of the detected property comprises analyzing first and second harmonics of the oscillated detected property.

6. The method of claim 1, wherein the first imprint template alignment grating extends in a direction which is parallel to the direction of oscillation of the relative position of the imprint template and the substrate.

7. The method of claim 1, wherein the first imprint template alignment grating extends in a direction which is at an angle with respect to the direction of oscillation of the relative position of the imprint template and the substrate.

8. The method of claim 1, wherein the amplitude of the relative position oscillation lies within a range of 50 nm to 1000 nm.

9. The method of claim 1, wherein the relative position oscillation has a frequency which lies within a range of 10 Hz to 1 kHz.

10. The method of claim 1, wherein the pitch of the first imprint template alignment grating and the pitch of the first substrate alignment grating lies in the range of 300 nm to 2000 nm.

11. The method of claim 1, wherein the relative position oscillation arises from oscillation of the position of the substrate.

12. The method of claim 1, wherein the relative position oscillation is sinusoidal.

13. A method of determining an offset between an imprint template and a substrate, using a first alignment grating on the imprint template and a first alignment grating on the substrate, the method comprising:
bringing the first imprint template alignment grating and the first substrate alignment grating sufficiently close together that they form a composite grating;
directing an alignment radiation beam at the composite grating while oscillating a relative position of the imprint template and the substrate;
detecting a property of alignment radiation which is reflected from the composite grating; and
determining the offset by analyzing oscillation of the detected property arising from the oscillation of the relative position of the imprint template and the substrate, wherein the relative position oscillation is sinusoidal, and
wherein the relative position oscillation satisfies the condition $2\pi\Delta L/P = 2.63$, where $\Delta L$ is the amplitude of the relative position oscillation, and P is the pitch of the first imprint template alignment grating measured in the direction of the relative position oscillation.

14. A method of determining an offset between an imprint template and a substrate, using a first alignment grating on the imprint template and a first alignment grating on the substrate, the method comprising:
bringing the first imprint template alignment grating and the first substrate alignment grating sufficiently close together that they form a composite grating;
directing an alignment radiation beam at the composite grating while oscillating a relative position of the imprint template and the substrate;
detecting a property of alignment radiation which is reflected from the composite grating;
determining the offset by analyzing oscillation of the detected property arising from the oscillation of the relative position of the imprint template and the substrate;
repeating the bringing, directing, detecting and determining for a second imprint template alignment grating and a second substrate alignment grating in order to determine a second offset; and
using the first offset and the second offset to achieve an alignment of the substrate and the imprint template.

15. The method of claim 14, wherein the method for the first imprint template alignment grating and the first substrate alignment grating, and the method for the second imprint template alignment grating and the second substrate alignment grating are performed simultaneously.

16. The method of claim 14, wherein the first imprint template alignment grating and the second imprint template alignment grating extend in transverse directions.

17. The method of claim 14, wherein the relative position of the imprint template and the substrate is oscillated in a single direction during determination of the first and second offsets.

18. The method of claim 14, wherein the amplitude of the relative position oscillation within a range of 50 nm to 1000 nm.

19. The method of claim 14, wherein the relative position oscillation is sinusoidal.

20. The method of claim 14, wherein a pitch of the first imprint template alignment grating is substantially equal to a pitch of the first substrate alignment grating.

* * * * *